United States Patent

Clark

[15] 3,672,034

[45] June 27, 1972

[54] METHOD FOR BONDING A BEAM-LEAD DEVICE TO A SUBSTRATE

[72] Inventor: James E. Clark, Coopersburg, Pa.

[73] Assignee: Bell Telephone Laboratories, Incorporated, Murray Hill, Berkeley Heights, N.J.

[22] Filed: Jan. 14, 1970

[21] Appl. No.: 7,330

Related U.S. Application Data

[62] Division of Ser. No. 646,251, June 15, 1967.

[52] U.S. Cl. ..............................29/471.1, 29/493, 29/497.5, 29/577, 29/589, 29/626, 29/628

[51] Int. Cl. ..........................................................B23k 31/02

[58] Field of Search ..................29/471.1, 471.3, 493, 497.5, 29/577, 589, 590, 591, 628

[56] References Cited

UNITED STATES PATENTS

| | | | |
|---|---|---|---|
| 2,629,806 | 2/1953 | Anderson | 29/493 X |
| 3,217,957 | 11/1965 | Jarvie et al. | 29/470.1 X |
| 3,404,213 | 10/1968 | Brookover et al. | 29/627 X |
| 3,405,441 | 10/1968 | Asher et al. | 29/627 |
| 3,409,977 | 11/1968 | Johnson | 29/589 X |
| 3,475,814 | 11/1969 | Santangini | 29/628 X |
| 3,505,726 | 4/1970 | Kleinedler et al. | 29/497.5 X |
| 3,574,923 | 4/1971 | Cushman | 29/471.1 |
| 3,575,333 | 4/1971 | Kulicki, Jr. et al. | 29/471.1 X |

*Primary Examiner*—John F. Campbell
*Assistant Examiner*—Ronald J. Shore
*Attorney*—R. J. Guenther and Arthur J. Torsiglieri

[57] ABSTRACT

A process and an apparatus are disclosed for the thermocompression bonding of beam-lead integrated circuits to a series of conductor patterns located on a substrate.

The flat tip of a hollow rectangular rod comprises the heating unit. The beam-lead device is positioned on a substrate; the substrate is mounted on a carrier; and, illustratively, the carrier is located on a wobble table. When appropriate means undulate the wobble table, the beam leads are rocked into successive contact with the heating unit and thereby are bonded to the substrate.

22 Claims, 3 Drawing Figures

METHOD FOR BONDING A BEAM-LEAD DEVICE TO A SUBSTRATE

This application is a division of patent application, Ser. No. 646,251, filed June 15, 1967.

BACKGROUND OF THE INVENTION

From the beginnings of semiconductor technology, connecting a semiconductor element to the rest of the circuit has been a difficult task. The technique that evolved comprised several steps. On the surface of a semiconductor, several contact areas were formed. The semiconductor was then mounted on a platform through the base of which several insulated leads had been passed. Skilled technicians then connected the leads to the appropriate contact area by bonding, one at a time, a fine wire to each lead and to its related contact area. Since each bond was formed separately, the operation was quite expensive, requiring costly machinery and a highly skilled operator.

To reduce the cost of connecting the semiconductor to the rest of the circuit and to improve the connection itself, the beam-lead method was developed. In brief, this technique forms on the semiconductor the necessary connectors, called beam leads, as the final stage of the semiconductor fabrication process. The connectors are then bonded to the rest of the circuit. With the increasing commercial importance of integrated circuit devices that perform the function of many semiconductor elements in the volume once occupied by one, the beam-lead method is especially advantageous because it provides a good contact between the beam lead and the integrated circuit device and makes more efficient use of the area available on the surface of the device.

Nevertheless, problems still remain in connecting the beam leads to the rest of the circuit. Typically, the circuit pattern, a portion of which is designed for connection to the beam leads, is formed in a two-dimensional array on the surface of an insulating material. The beam-lead integrated circuit device is appropriately positioned on top of the pattern, and a bonding tool is then applied simultaneously to the beam leads. This technique, however, is subject to two problems. First, the connection areas of the circuit pattern frequently do not lie in a plane that is parallel to the bonding surface of the bonding tool. Moreover, the beam leads may not lie in a plane that is parallel to both the connection areas and the bonding surface. Hence it may be difficult for the bonding tool to make uniform contact to the beam leads. Secondly, if uniform simultaneous contact is made, severe stresses may be created in the beam leads and in the connections between the beam leads and the integrated circuit device. More specifically, the pressure of the bonding tool tends to push some of the material in the leads out of the region of the bond. Because the beam leads that are located on opposite sides of the semiconductor are bonded simultaneously, this develops an inward stress on the beam-lead device. And this manifests itself as a shear force that tends to buckle the beam leads or separate them from the integrated circuit device or lift the device off the surface of the substrate that bears the circuit pattern. The shear force is of course undesirable since it can break the connection to the integrated circuit device. The lifting that can result is also undesirable because this increases the thermal impedance between the device and the substrate when a silicone resin or similar filler is inserted between the two.

SUMMARY OF THE INVENTION

Accordingly it is an object of this invention to facilitate uniform thermocompression bonding of multi-lead semiconductor devices.

It is a further object of this invention to minimize the deleterious effects on the beam leads caused by the shear forces set up when the beam leads of an integrated circuit device are thermocompression bonded.

These and other objects of the invention are achieved by a process of rocking the beam leads into successive contact with the bonding tool, thereby bonding the leads to the substrate.

In practicing this invention, the bonding tool used has a flat tip at the end of a hollow rectangular rod. The beam-lead device is positioned on a substrate in proper register with a circuit pattern on the substrate surface. The substrate is mounted on a carrier, and the carrier is mounted on a wobble table located under the bonding tool. When appropriate means undulate the wobble table, the beam leads are rocked into successive contact with the bonding tool and thereby are thermocompression bonded to the circuit pattern.

Because the bonding tool against which the beam leads are rocked is gravity- or spring-loaded, each beam lead is certain to be contacted and bonded. Hence it does not matter if the beam leads do not lie in a plane that is parallel to both the circuit pattern and the bonding surface. Because diametrically opposed leads are never bonded at the same time, an inward force on the beam-lead device is not created on opposite sides at any one time; and even if one of two diametrically opposed leads is already bonded when the second lead is bonded, the inward force is only about half of that created by simultaneously bonding diametrically opposed leads. Moreover, because the flat tip of the bonding tool is rocked onto a beam lead in a direction that is perpendicular to the axis of the lead, a substantial portion of the material that is compressed is pushed in a direction perpendicular to the axis of the lead. By bonding the leads at different times and by pushing some of the material compressed in a perpendicular direction rather than along the axis of a lead, the shear forces that are created during the bonding are minimized. Thus there is less likelihood that the beam lead will be severed from its connection to the semiconductor surface or that the beam-lead device will be lifted off the surface of the substrate that bears the circuit pattern.

DESCRIPTION OF THE DRAWING

These and other objects and features of the invention will be better understood from a consideration of the following detailed description taken in conjunction with the accompanying drawing in which.

DETAILED DESCRIPTION

Figure 1:
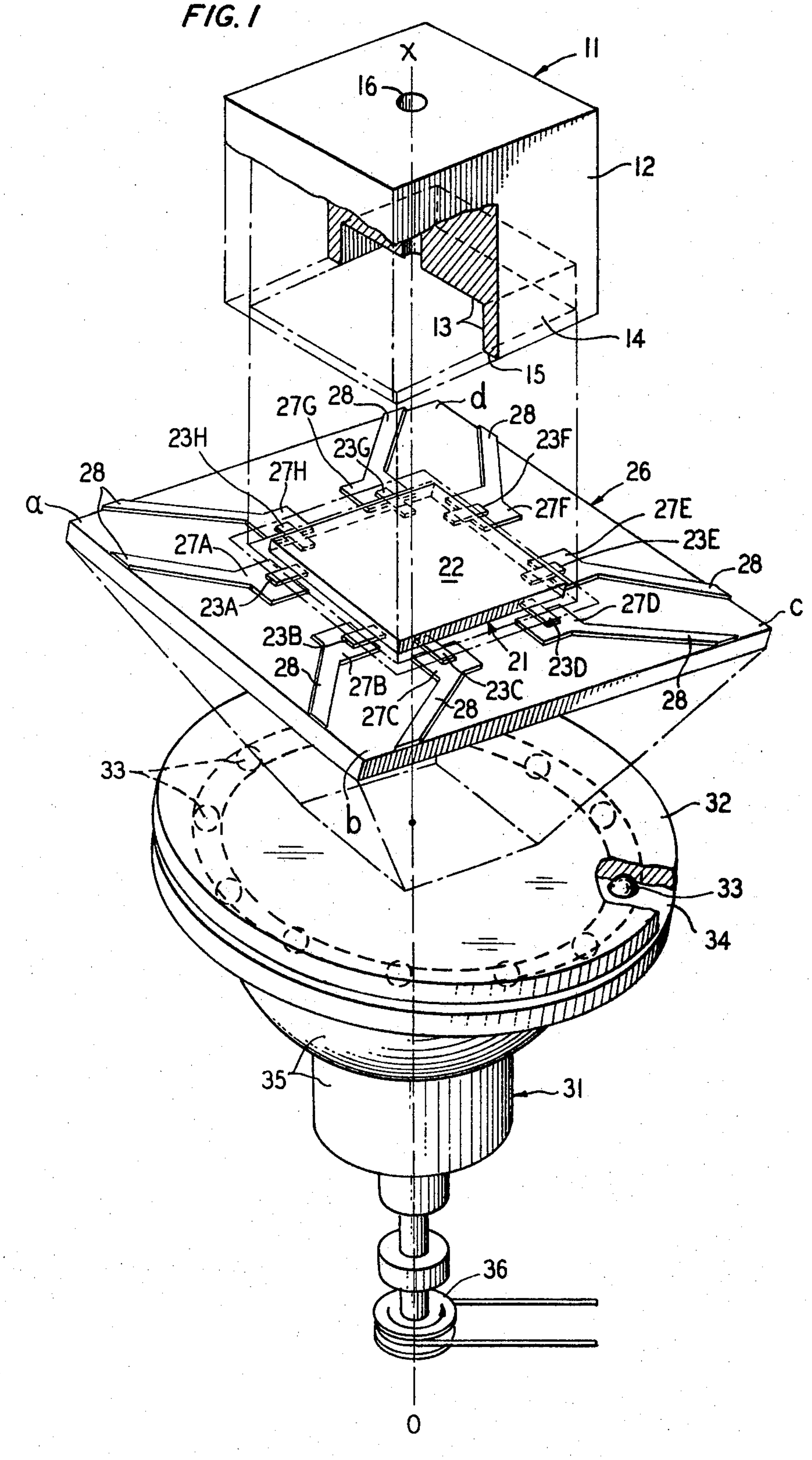
FIG. 1 is a schematic view of the bonding apparatus, partially in section and partially in perspective, showing the relative positioning of the tool, the parts to be bonded and the wobble table.

Referring now to FIG. 1, there is shown one embodiment of the invention comprising a heated bonding tool 11, a beam-lead integrated circuit device 21 mounted on a ceramic substrate 26, and a wobble table 31 for wobbling the beam-lead device 21 and the substrate 26 into contact with bonding tool 11.

Bonding tool 11 comprises a rectangular rod 12 at one end of which is a recess 13 that accommodates integrated circuit device 21. The remaining portion of this end of rod 12 constitutes tip 14 of bonding tool 11. The bonding face 15 of tip 14 comprises a rectangular border area of uniform width lying in a plane perpendicular to axis OX which is collinear with the longitudinal axis of rod 12. Rod 12 includes an internal tube 16 for applying a suction to hold the integrated circuit device in the bonding tool. Bonding tool 11 is mounted on a conventional mechanical structure that affords the tool substantial vertical and horizontal displacement. During the bonding operation, the bonding tool is forced against the beam leads on the substrate by either gravity or springs.

Beam-lead integrated circuit device 21 comprises a body 22 of semiconductor material and a series of electrically conductive beam leads 23A to 23H extending beyond the edge of one surface of body 22. These beam leads 23A–H are mounted in register with bonding pads 27A to 27H that are elements of electrically conductive circuit pattern 28 mounted on the upper surface of substrate 26.

The substrate is positioned on nonrotating plate 32, which is an element of wobble table 31. Plate 32 rests on bearings 33 which are contained and supported by rotating plate 34. Plate 34, in turn, is supported by tilting and supporting means 35 and is rotated about central axis OX by rotating means 36.

Figure 2:
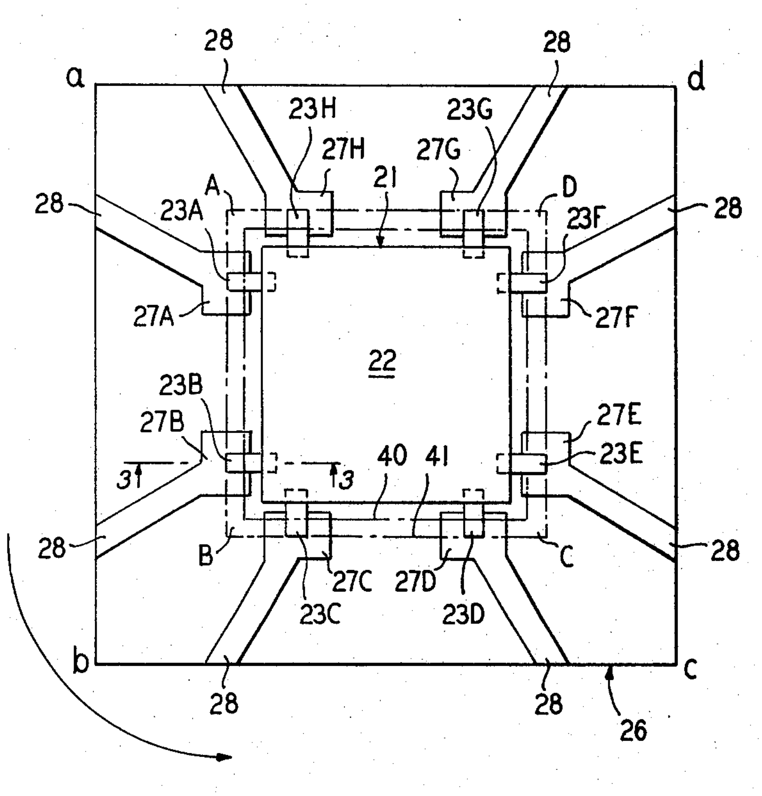
FIG. 2 is a plan view of the beam-lead integrated circuit device, mounted on a substrate, showing the relation between the integrated circuit device, the substrate and the tip of the bonding tool.

Further understanding of the relationship of the elements is provided by the plan view of FIG. 2. Here again element 21 is the beam-lead integrated circuit device; 22 the semiconductor body; 23A–H the beam leads; 26 the ceramic substrate; 27A–H the bonding pads; and 28 the circuit pattern. The dotted lines 40 and 41 show the inside and outside edges of bonding face 15 of bonding tool 11, shown in FIG. 1, in position for bonding the beam leads.

Prior to the bonding operation, the substrate is so positioned on nonrotating plate 32 that bonding pads 27A–H are substantially centered about axis OX. Integrated circuit device 21 is then positioned on substrate 26 so that beam leads 23A–H are in proper alignment with bonding pads 27A–H. This may conveniently be done by loading device 21 into a suitably designed nest, beam leads facing down, picking the device out of the nest with the vacuum pickup incorporated in recess 13 and tube 16 of bonding tool 11, and positioning the device on substrate 26. Inasmuch as the extremities of beam leads 23 are precisely determined, in contrast to the less well defined boundaries of semiconductor body 22, it is possible to fix precisely the position of device 21 in the nest by making an accurately machined nest, the dimensions of which just accommodate the beam leads. Because bonding tool 11 can be precisely located with respect to both the nest and bonding pads 27 on substrate 26, leads 23 can be accurately positioned on bonding pads 27.

Once device 21 is accurately aligned on substrate 26, the bonding operation can begin. The nonrotating plate 32 is tilted about a point defined by the intersection of axis OX and the upper surface of the substrate. The amount of this tilt will, of course, vary with the thickness of the beam leads, the geometry of the integrated circuit device, and the location of the beam leads on the device. For most devices presently conceived, nonrotating plate 32 would be tilted approximately 0.5° to 3.0° from the plane perpendicular to axis OX. As a result substrate 26 comes in contact with face 15 of bonding tool 11 at one point, which can be assumed to be point A on FIG. 2. If tilting and supporting means 35 are now rotated about axis OX, plate 34 rotates about axis OX and nonrotating plate 32 wobbles, or undulates, about the point defined by the intersection of axis OX and the upper surface of the substrate. In mechanical engineering terms, a line that intersects axis OX and is situate in the plane of rotating plate 34 precesses about axis OX at a fixed nutation angle. At the same time, a line that intersects axis OX and is situate in the plane of nonrotating plate 32 does not precess, since it does not rotate; but it does nutate.

More specifically, as plate 34 rotates in a counter-clockwise direction as indicated by the arrow of FIG. 2, substrate 26 rises on sides *ab* and *bc* and falls on sides *cd* and *da*. As it rises on side *ab*, the substrate pushes the beam leads on side *ab* into contact with face 15 of the bonding tool. First, beam lead 23A, the beam lead closest to point A, is rocked into contact with the face; then beam lead 23B, the beam lead next in line, is pushed against the face of the bonding tool. Even if the plane in which the beam leads lie is not parallel with the planes in which the bonding surface and the bonding pads are situate, each lead on side *ab* will be bonded to its bonding pad because the bonding tool is gravity- or spring-loaded against the beam leads and only the leads on side *ab* are contacted. Finally tilting means 35 has been rotated 90° and the substrate is in contact with the bonding tool at point B.

Rotation of tilting means 35 continues in a counter-clockwise direction. Side *bc* of the substrate is now raised against face 15 of the bonding tool. Beam lead 23C, the beam lead closet to point B, is the next to be rocked into contact with the face, and then beam lead 23D. In similar fashion sides *cd* and *da* are pushed by the tilting means 35 against the face of the bonding tool. Because the bonding tool is forced against the beam leads and because the successive bonding operation proceeds on only one side of the tool and the integrated circuit device at a time, all of the beam leads of the device will be contacted and bonded once the complete rotation of 360° has been made.

As can be appreciated by those skilled in the art, the embodiment just described admits of many variations in its practice. As shown in FIG. 1, the bonding face 15 of bonding tool 11 is flat. Such a geometry allows for the easiest manufacture and the simplest maintenance of the bonding face; and the flat bonding face does make satisfactory bonds of the beam leads to the bonding pad. However, the flat bonding face causes greater deformation to the beam leads adjacent to the four corners of the beam-lead device than it does to any leads in between the corner leads. Furthermore, when the flat surface of the substrate is wobbled into contact with the flat bonding face of the bonding tool, there is one particular instant when all the beam leads on one side of the device are in contact with the bonding face. If elimination of these two effects is desired, the bonding face can be shaped as part of a conic section.

Figure 3:
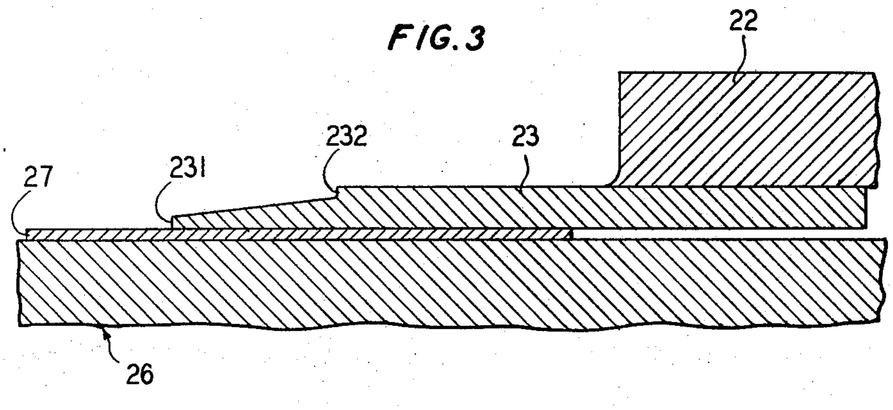
FIG. 3 is a cross-section view through line 3—3 of FIG. 2 of the bond that is formed by the apparatus of FIG. 1.

A cross section of the bond made with this invention is shown in FIG. 3, depicting semiconductor body 22, a beam lead 23, a bonding pad 27 and substrate 26. Because nonrotating plate 32 and therefore beam-lead device 21 and substrate 26 are tilted during the bonding operation, the greatest deformation in the beam lead occurs at its outer extremity 231 and the least at the inner edge 232 of the bond. For a lead of maximum strength, there should be no notch at edge 232 of the bond; and by suitable adjustment of the tilt of the wobble table it is possible to provide a bond in which the deformation tapers off to zero.

In contrast to the wobble table technique, simultaneous bonding of all the beam leads tends to flatten each beam lead uniformly so that the deformation at the inner and the outer edges of the bond is substantially the same. This, however, results in an abrupt change in the cross-sectional area of the lead — an obvious point of weakness.

The embodiment described has eight beam leads and the circuit pattern provides for one integrated circuit device. However, beam-lead devices with 18 beam leads have been bonded in accordance with the invention and it is expected that devices with 60 or more leads may likewise be bonded. Regardless of the number of leads that are used on the device, the wobble technique that has been described is capable of producing satisfactory bonds.

Likewise the wobble technique can be adapted to bond more than one integrated circuit device to an appropriate circuit pattern. To do this, it is only necessary to provide a suitable mechanism, on which the substrate can be mounted, that can move the substrate and therefore the circuit pattern from one bonding location to another. Thus, with the aid of a computer control or an alignment pattern, it would be possible to center each bonding location at the center of the wobble table in an appropriate position for bonding.

The wobble method and apparatus shown is only illustrative of the method and the mechanism that can be used for bonding sequentially in accordance with this invention. It would also be possible to perform the bonding operation by wobbling the bonding tool instead of the substrate. Numerous other modifications can be made by those skilled in the art without departing from the spirit and scope of the invention.

What is claimed is:

1. The method of bonding an array of leads of a multi-lead semiconductor device to electrically conductive areas on a first surface of a substrate comprising the steps of:

positioning the leads of the device in alignment with the conductive areas on the substrate and a bonding tool having a bonding face that faces the first surface of the substrate; and bonding the array of leads to the conductive areas on the substrate by rocking either the bonding face toward the substrate or the substrate toward the bonding face to establish bonding contact successively between the bonding face and at least some of the different leads of the semiconductor device that are located between the bonding face and the substrate.

2. The method of claim 1 wherein the bonding step comprises the steps of:

tilting either the substrate or the bonding face to reduce the distance between part of the bonding face and part of the substrate enough to establish a region where bonding contact can be made between the bonding face and leads located between the bonding face and the substrate and moving the region where bonding contact can be made to establish bonding contact successively between the bonding face and at least some of the different leads of the semiconductor device.

3. The method of claim 2 wherein the region where bonding contact can be made is moved by rotating about an axis through the substrate either a means for tilting the substrate or a means for tilting the bonding face.

4. The method of claim 1 wherein the bonding step comprises the step of undulating the substrate about a point located in or near its first surface.

5. The method of claim 1 wherein the multi-lead semiconductor device has at least three sides and the bonding step comprises the step of successively rocking each side of the semiconductor device toward the bonding face to establish bonding contact between any leads on each side of the device and the bonding face.

6. The method of claim 1 further comprising the steps of:

positioning a second multi-lead semiconductor device in alignment with the bonding tool and a second set of conductive areas on the substrate; and bonding the array of leads of the second semiconductor device to the second set of conductive areas on the substrate by rocking either the bonding face toward the substrate or the substrate toward the bonding face to establish bonding contact successively between the bonding face and at least some of the different leads of the second semiconductor device that are located between the bonding face and the substrate.

7. The method of claim 1 wherein the bonding face lies in a plane perpendicular to an axis of the bonding tool and the bonding step comprises the steps of:

tilting the substrate about a point on a line collinear with said axis to form a non-zero angle with the plane of the bonding face to establish a region where bonding contact can be made between the bonding face and any leads located in said region between the bonding face and the substrate and moving about said axis the region where bonding contact can be made to establish bonding contact successively between the bonding face and at least some of the different leads of the semiconductor device.

8. The method of claim 7 wherein the region where bonding contact can be made is moved about said axis by rotating about said axis a means for tilting the substrate to form the non-zero angle with the bonding face.

9. The method of claim 1 wherein the bonding face lies in a plane and the bonding step comprises the steps of:

tilting the bonding face to form a non-zero angle with the substrate to establish a region where bonding contact can be made between the bonding face and any leads located in said region between the bonding face and the substrate and moving about an axis perpendicular to the substrate the region where bonding contact can be made to establish bonding contact successively between the bonding face and at least some of the different leads of the semiconductor device.

10. The method of claim 9 wherein the region where bonding contact can be made is moved about said axis by rotating about said axis a means for tilting the bonding face to form the non-zero angle with the substrate.

11. The method of bonding an array of leads of a multi-lead integrated circuit semiconductor device to electrically conductive areas on a substrate comprising of steps of:

positioning the leads of the device in alignment with both the conductive areas on the substrate and a thermocompression bonding tool having a tip that faces the conductive areas on the substrate and includes a recess substantially conforming to the device; and bonding the array of leads to the conductive areas on the substrate;

wherein the bonding step is characterized by the step of rocking either the bonding face toward the substrate or the substrate toward the bonding face to establish bonding contact successively between the bonding face and different leads of the semiconductor device that are located between the bonding tip and the substrate.

12. The method of claim 11 wherein:

the multi-lead device is rectangular;

the recess of the bonding tool tip is rectangular, thereby defining a four-sided tip; and during the bonding operation each side of the bonding tool tip successively is rocked toward the substrate to make bonding contact between the bonding tool tip and leads of the device that are located between the bonding tip and the substrate.

13. The method of claim 12 wherein each side of the bonding tool tip is rocked to establish bonding contact successively between that side of the bonding tip and at least some of any leads of the semiconductor device that are located between that side of the bonding tip and the substrate.

14. The method of claim 13 wherein the multi-lead integrated circuit device that is bonded is a beam lead device.

15. The method of claim 11 wherein;

the multi-lead device is rectangular;

the recess of the bonding tool tip is rectangular, thereby defining a four-sided tip; and during the bonding operation each side of the device successively is rocked toward the bonding tool tip to make bonding contact between the bonding tool tip and leads of the device that are located between the bonding tip and the substrate.

16. The method of claim 15 wherein each side of the multi-lead integrated circuit device is rocked to establish bonding contact successively between the bonding tool tip and at least some of any leads of the device that are located on that side.

17. The method of claim 16 wherein the multi-lead integrated circuit device is a beam lead device.

18. A method of bonding a plurality of beam leads of a beam lead semiconductor device to electrically conductive areas on a substrate comprising the steps of:

positioning the device between the conductive areas and a bonding face of a bonding tool with the beam leads in alignment with the conductive areas on the substrate; and bonding the leads to the conductive areas on the substrate by rocking either the bonding face toward the substrate or the substrate toward the bonding face to establish bonding contact successively between the bonding face and at least some of the different leads of the semiconductor device that are located between the bonding face and the substrate.

19. The method of claim 18 wherein the rocking step comprises the steps of:

tilting either the substrate or the bonding face to form a non-zero angle between them and to establish a region where bonding contact can be made between the bonding face and any leads located in said region between the bonding face and the substrate and moving the region where bonding contact can be made to establish bonding contact successively between the bonding face and at least some of the different leads of the semiconductor device.

20. The method of claim 19 wherein the region where bonding contact can be made is moved by rotating about an axis through the substrate either a means for tilting the substrate or a means for tilting the bonding face.

21. The method of claim 20 wherein said axis of rotation passes through approximately the centers of the bonding face and the beam lead device.

22. The method of claim 18 wherein the semiconductor device is positioned by the bonding tool with its beam leads in alignment with the conductive areas on the substrate.

* * * * *